(12) United States Patent
Gardner

(10) Patent No.: US 7,071,749 B2
(45) Date of Patent: Jul. 4, 2006

(54) ERROR CORRECTING LATCH

(75) Inventor: Harry N. Gardner, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 15 days.

(21) Appl. No.: 10/868,706

(22) Filed: Jun. 15, 2004

(65) Prior Publication Data

US 2004/0227551 A1    Nov. 18, 2004

Related U.S. Application Data

(60) Continuation-in-part of application No. 10/299,461, filed on Nov. 19, 2002, now Pat. No. 6,831,496, which is a division of application No. 10/107,293, filed on Mar. 25, 2002, now Pat. No. 6,573,774.

(51) Int. Cl.
*H03K 3/289* (2006.01)
(52) U.S. Cl. .................................. 327/202; 714/797
(58) Field of Classification Search ............... 714/797; 327/202
See application file for complete search history.

(56) References Cited

U.S. PATENT DOCUMENTS

| | | |
|---|---|---|
| 3,783,308 A | 1/1974 | Hoffman |
| 4,631,420 A | 12/1986 | Hollis et al. |
| 4,785,200 A | 11/1988 | Huntington |
| 4,786,865 A | 11/1988 | Arimura et al. |
| 4,797,804 A | 1/1989 | Rockett, Jr. |
| 4,805,148 A | 2/1989 | Diehl-Nagle et al. |
| 4,809,226 A | 2/1989 | Ochoa, Jr. |
| 4,852,060 A | 7/1989 | Rockett, Jr. |
| 4,863,878 A | 9/1989 | Hite et al. |
| 4,912,675 A | 3/1990 | Blake et al. |
| 4,914,629 A | 4/1990 | Blake et al. |
| 4,931,990 A | 6/1990 | Perkin |
| 4,956,814 A | 9/1990 | Houston |
| 5,031,180 A | 7/1991 | McIver et al. |
| 5,046,044 A | 9/1991 | Houston et al. |
| 5,053,848 A | 10/1991 | Houston et al. |
| 5,081,377 A | 1/1992 | Freyman |

(Continued)

OTHER PUBLICATIONS

Messenger, George C. and Ash, Milton S., The Effects of Radiation on Electronic Systems; Van Nostrand Reinhold Company, New York, 1986, pp. 296-325.

(Continued)

*Primary Examiner*—My-Trang Nu Ton
(74) *Attorney, Agent, or Firm*—Peter J. Meza; William J. Kubida; Hogan & Hartson LLP

(57) ABSTRACT

An error-correcting partial latch stage includes a first pass gate having an input for receiving a data input signal, an output, and a control node for receiving a control signal, a second pass gate having an input coupled to the output of the first pass gate, an output for providing a data output signal, and a control node for receiving the control signal, an inverter having an input coupled to the output of the first pass gate and an output; and a correcting inverter stage having a first input coupled to the output of the inverter, and second and third inputs for receiving voting signals from adjacent error-correcting latch stages, and an output coupled to the output of the second pass gate. A full latch stage includes three interconnected partial latch stages. The full latch stage has a high degree of immunity from SEU events and from on-chip noise coupling.

20 Claims, 17 Drawing Sheets

U.S. PATENT DOCUMENTS

| | | | |
|---|---|---|---|
| 5,111,429 A | 5/1992 | Whitaker | |
| 5,117,442 A | 5/1992 | Hall | |
| 5,196,734 A | 3/1993 | Han | |
| 5,204,990 A | 4/1993 | Blake et al. | |
| 5,307,142 A | 4/1994 | Corbett et al. | |
| 5,311,070 A | 5/1994 | Dooley | |
| 5,315,544 A | 5/1994 | Yokote et al. | |
| 5,331,164 A | 7/1994 | Buehler et al. | |
| 5,341,009 A | 8/1994 | Young et al. | |
| 5,406,513 A | 4/1995 | Canaris et al. | |
| 5,418,473 A | 5/1995 | Canaris | |
| 5,463,340 A | 10/1995 | Takabatake et al. | |
| 5,504,703 A | 4/1996 | Bansal | |
| 5,525,923 A | 6/1996 | Bialas, Jr. et al. | |
| 5,648,035 A | 7/1997 | Okamoto et al. | |
| 5,649,097 A | 7/1997 | Brodnax et al. | |
| 5,657,267 A | 8/1997 | Levi | |
| 5,831,462 A | 11/1998 | Witt et al. | |
| 5,864,312 A | 1/1999 | Shou et al. | |
| 5,870,322 A | 2/1999 | Kim | |
| 6,115,318 A * | 9/2000 | Keeth | 365/233 |
| 6,127,864 A * | 10/2000 | Mavis et al. | 327/144 |
| 6,348,824 B1 | 2/2002 | Grondalski et al. | |
| 6,417,710 B1 | 7/2002 | Bartholet | |
| 6,448,829 B1 | 9/2002 | Saraf | |
| 6,480,019 B1 * | 11/2002 | Waldie et al. | 326/16 |
| 6,504,410 B1 * | 1/2003 | Waldie et al. | 327/199 |
| 6,504,411 B1 * | 1/2003 | Cartagena | 327/199 |
| 6,507,212 B1 | 1/2003 | Lall | |
| 6,637,005 B1 * | 10/2003 | Kohnen | 714/797 |

OTHER PUBLICATIONS

Messenger, George C. and Ash, Milton S., Single Event Phenomena, Chapman & Hall, International Thomson Publishing, 1997, pp. 179-182.

FPGAS for Space Applications, *ACTEI*, Mar. 15, 2003, Actel Corporation, Sunnyvale, CA, pp. 8.

Maley, Gerald A., Manual of Logic Circuits, Prentice-Hall, Inc., Englewood Cliffs, NJ, 1970, pp. I, II, 49, 164-165.

* cited by examiner

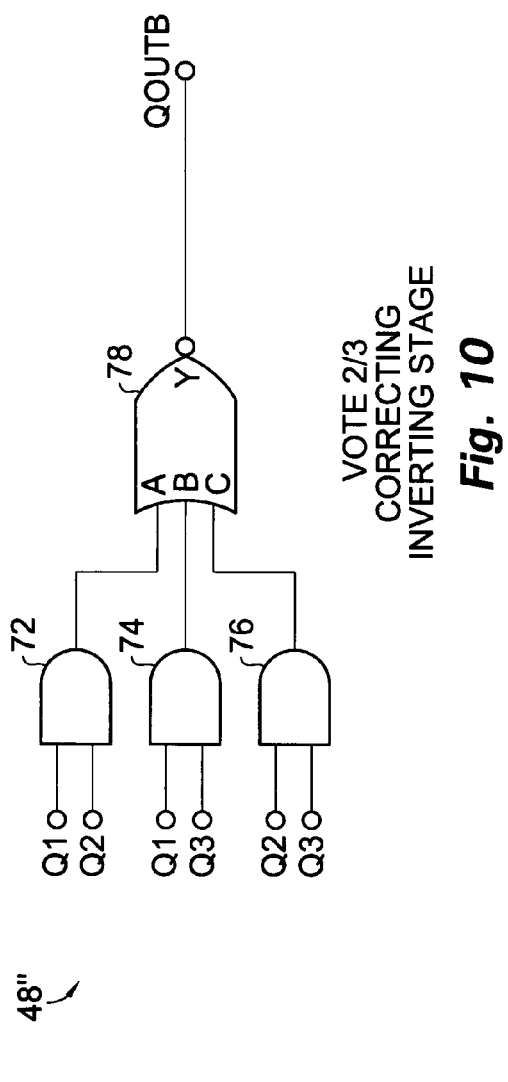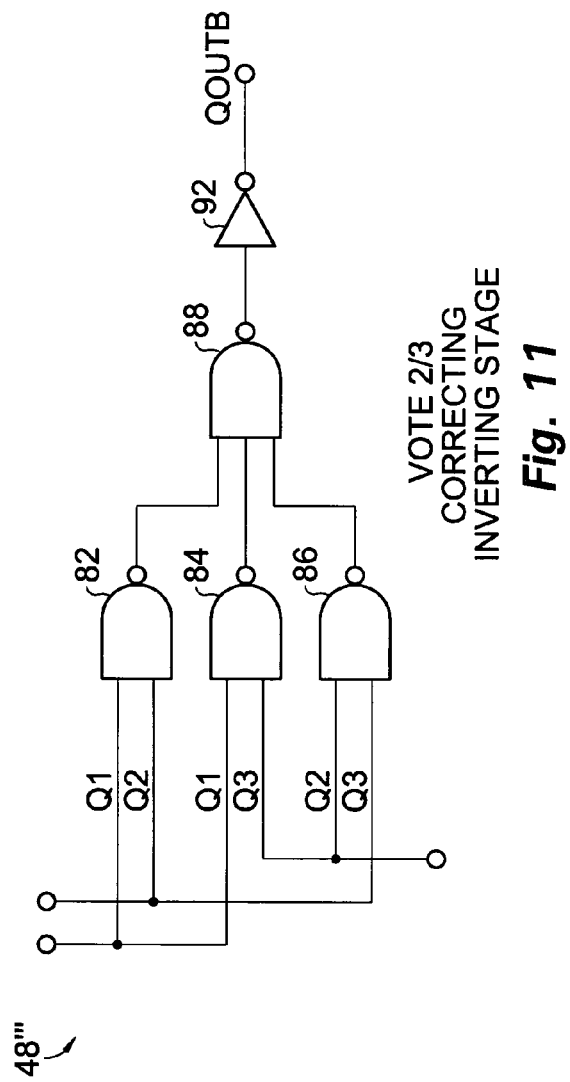

FULL LATCH USING PASS GATES/SINGLE INPUT/OUTPUT

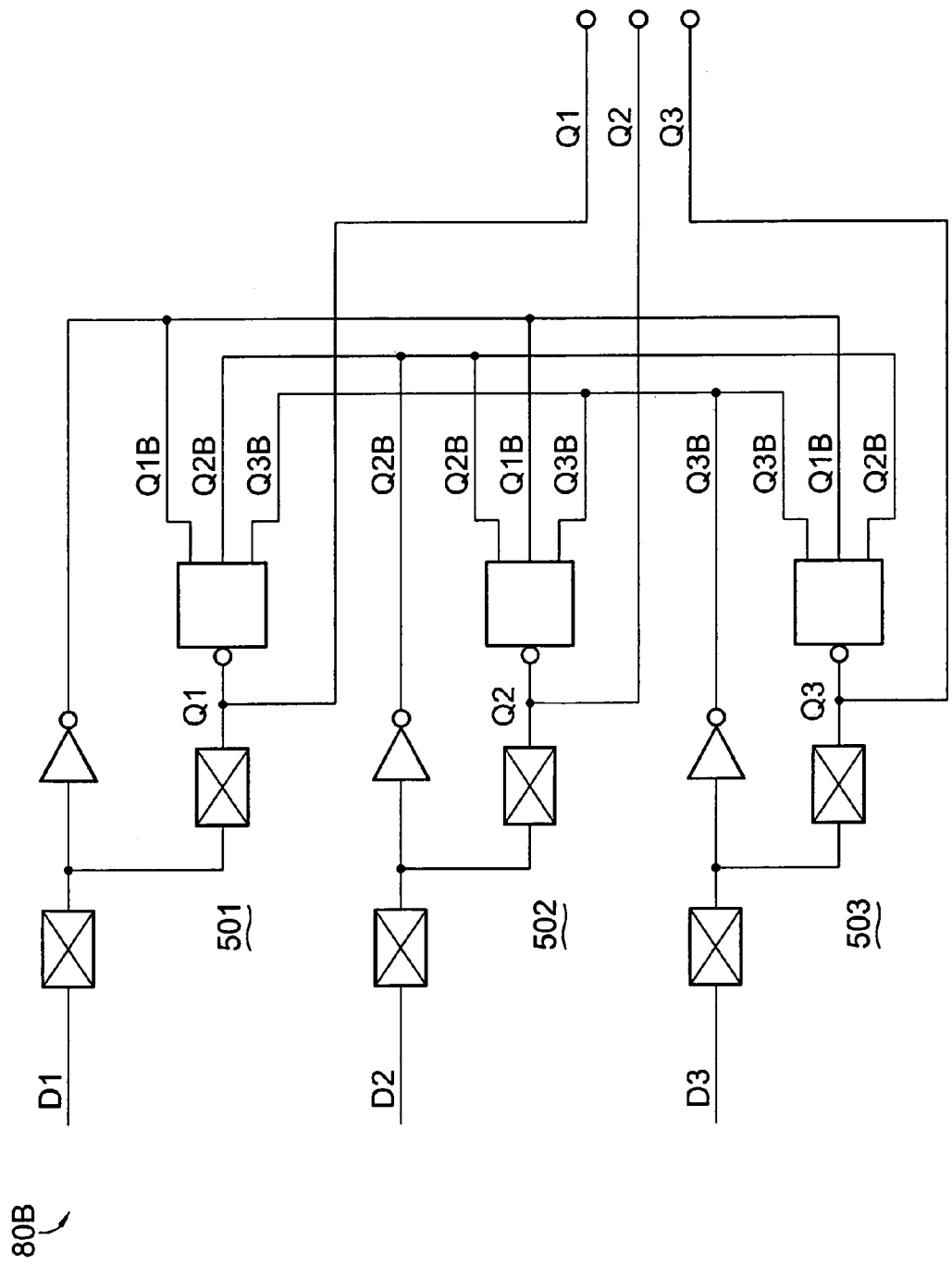

FULL LATCH USING PASS GATES/CORRECTING OUTPUTS

ERROR CORRECTING LATCH

RELATED APPLICATIONS

The present application is a Continuation-In-Part of U.S. Divisional patent application Ser. No. 10/299,461 filed Nov. 19, 2002 now U.S. Pat. No. 6,831,496, which is a Divisional Patent Application of U.S. patent application Ser. No. 10/107,293 filed Mar. 25, 2002, now U.S. Pat. No. 6,573,774, incorporated herein by reference in its entirety, which is assigned to the assignee of the present application.

BACKGROUND OF THE INVENTION

This invention relates generally to integrated latch or flip-flop circuits, and, more particularly, to a technique for correcting errors in the output signal of the latch due to single event upsets or on-chip coupling noise.

A single event upset (SEU) is the result of an ion transitioning through a semiconductor structure and, in doing so, causing charge to be deposited on critical circuit nodes within that structure. In a CMOS logic circuit, such as a latch circuit, this can cause an unintended switch in the output logic state, creating potentially catastrophic consequences for the system. In the case of storage cells and latch circuits, the primary SEU problem lies in the feedback path, where amplification and feedback of noise on a critical node can permanently change the cell's logic state.

Known SEU hardening or error-correcting techniques for CMOS logic include the use of redundant circuit paths, and for memory cells it is known to use cross-coupled resistors or capacitors. Multiple circuit paths provide redundancy and allow implementation of voting schemes to reduce the effect of SEUs. The addition of cross-coupled resistors and capacitors in a storage cell slows the cell's ability to latch false data. However, each of these techniques has its drawbacks. The typical voting scheme uses appended digital logic to recombine the redundant paths, which complicates clocking of sequential circuitry and may actually exacerbate the effects of the SEU. The addition of cross-coupled resistors and capacitors in a storage cell involves more complicated fabrication processes and results in slower response to all input signals, thereby decreasing its operating speed.

A need remains, therefore, for a robust latch circuit solution that substantially reduces errors due to SEUs or on-chip noise coupling.

SUMMARY OF THE INVENTION

According to the present invention an error-correcting latch has the error-correcting circuitry built directly into the feedback path of the latch to ensure that errors due to SEUs or on-chip noise coupling are substantially reduced and are not fed through to the output as in prior art designs. The error-correcting latches of the present invention use a two-out-of-three voting scheme that is embedded into the feedback path of the latch itself.

A first embodiment of an error-correcting partial latch stage includes a first pass gate having an input for receiving a data input signal, an output, and a control node for receiving a control signal, a second pass gate having an input coupled to the output of the first pass gate, an output for providing a data output signal, and a control node for receiving the control signal, an inverter having an input coupled to the output of the first pass gate and an output; and a correcting inverter stage having a first input coupled to the output of the inverter, and second and third inputs for receiving voting signals from adjacent error-correcting latch stages, and an output coupled to the output of the second pass gate.

A second embodiment of an error-correcting partial latch stage includes a gated inverter having an input for receiving a data input signal, an output, and a control node for receiving a control signal, a pass gate having an input coupled to the output of the gated inverter, an output, and a control node for receiving the control signal, an inverter having an output coupled to the output of the pass gate, and a correcting inverter stage having a first input coupled to the output of the gated inverter, and second and third inputs for receiving voting signals from adjacent error-correcting latch stages, and an output coupled to the input of the inverter for providing a data output signal.

A third embodiment of an error-correcting partial latch stage includes a first pass gate having an input for receiving a data input signal, an output, and a control node for receiving a control signal, a second pass gate having an input coupled to the output of the first pass gate, an output for providing a data output signal, and a control node for receiving the control signal, an inverter having an input coupled to the output of the first pass gate and an output, a first delay path having an input coupled to the output of the inverter and an output, a second delay path having an input coupled to the output of the inverter and an output, and a correcting inverter stage having a first input coupled to the output of the inverter, a second input coupled to the output of the first delay path, a third input coupled to the output of the second delay path, and an output coupled to the output of the second pass gate.

A fourth embodiment of an error-correcting latch stage includes a gated inverter having an input for receiving a data input signal, an output, and a control node for receiving a control signal, a pass gate having an input coupled to the output of the gated inverter, an output, and a control node for receiving the control signal, an inverter having an output coupled to the output of the pass gate, a first delay path having an input coupled to the output of the gated inverter and an output, a second delay path having an input coupled to the output of the gated inverter and an output; and a correcting inverter stage having a first input coupled to the output of the gated inverter, a second input coupled to the output of the first delay path, a third input coupled to the output of the second delay path, and an output coupled to the input of the inverter for providing a data output signal.

A first embodiment of the correcting inverter stage includes first, second, and third two-input AND gates coupled to a three-input NOR gate. A second embodiment of the correcting inverter stage includes first, second, and third two-input NAND gates coupled to a three-input NAND gate. A third embodiment of the correcting inverter stage includes a CMOS transistor circuit comprising three differential PMOS stages coupled to three cascoded NMOS stages. Each of the correcting inverter stage embodiments preferably operates according to the same logic function.

For the first and second embodiments, a full latch stage includes three interconnected partial latch stages with an optional output correcting inverter stage for providing an extra measure of immunity to SEU events. A full latch stage for the first and second embodiments includes first, second, and third partial latch stages, each latch stage having an input for receiving a data input signal, a correcting inverter stage, and an output for providing an output signal. The output signals of the first, second, and third partial latch stages can be logically combined to provide the final output signal, or simply one of the individual outputs can be used as the final output signal.

If desired, an error-correcting full D-type master-slave flip-flop can be built having a master latch stage including first, second, and third partial latch stages, each latch stage having an input for receiving a data input signal, a correcting inverter stage, and an output for providing an intermediate signal, and a slave latch stage coupled to the master last stage including first, second, and third partial latch stages, each latch stage having an input for receiving the intermediate signal, a correcting inverter stage, and an output for providing an output signal. An error-correcting full D-type master-slave flip-flop can also be built using the delayed correcting latch, or a combination of the two.

A still further embodiment provides an extra measure of SEU event immunity by providing a parallel busing scheme for clock, data, and control signal inputs.

The foregoing and other objects, features and advantages of the invention will become more readily apparent from the following detailed description of a preferred embodiment of the invention, which proceeds with reference to the accompanying drawings.

BRIEF DESCRIPTION OF THE DRAWINGS

FIG. 10 is a schematic diagram of a "AND-NOR" logic gate implementation of the correcting inverter circuit used in the present invention;

FIG. 11 is a schematic diagram of a "NAND" logic gate implementation of the correcting inverter circuit used in the present invention;

FIG. 12B is a schematic diagram of a full correcting latch stage using the partial latch stages of FIG. 3 with provision for split inputs and outputs according to the present invention;

DETAILED DESCRIPTION

Figure 1A:
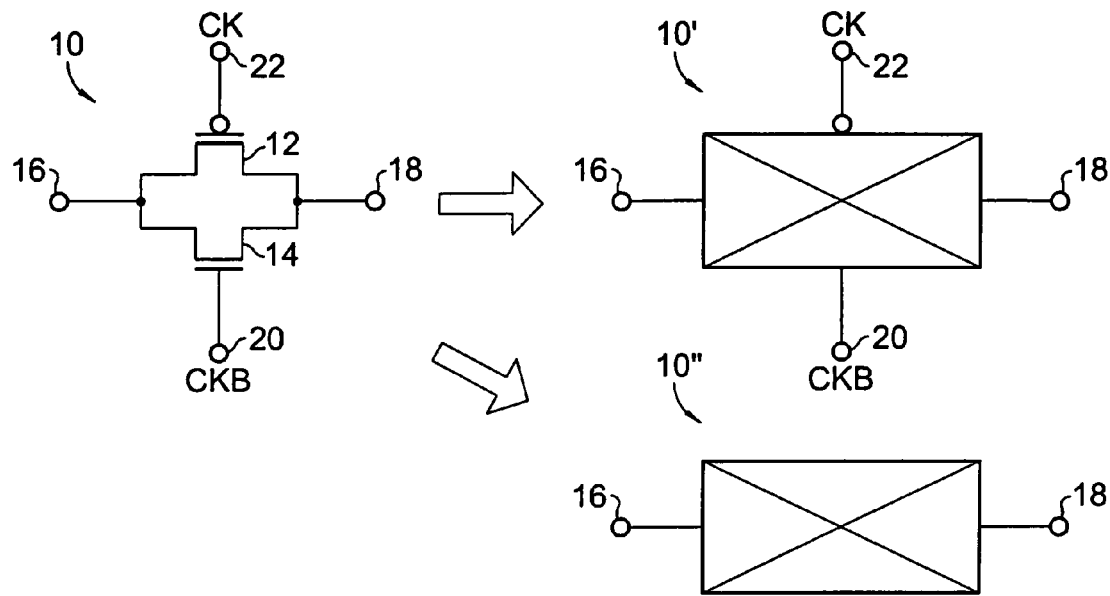
FIG. 1A is a schematic diagram of a non-inverting prior art pass gate circuit including an N-channel transistor in parallel combination with a P-channel transistor, and the corresponding symbols for a pass gate that are used in subsequent drawing figures.

Referring now to FIG. 1A, a conventional pass gate 10 is shown having an input terminal 16, an output terminal 18, a CK clock input terminal 22, and a CKB inverted clock input terminal 20. Pass gate 10 includes a parallel combination of a P-channel transistor 12 and an N-channel transistor 14, wherein the current paths of transistors 12 and 14 form the selective signal path controlled by the CK and CKB signals applied to the gates of transistors 12 and 14, respectively. A first symbol for pass gate 10' is shown in which the two transistors are represented as a single crossed rectangle, wherein only the input 16, output 18, and clock inputs 20 and 22 are shown. A simpler representation 10" for the pass gate is also shown in which only the input 16 and output 18 are labeled.

Figure 1B:
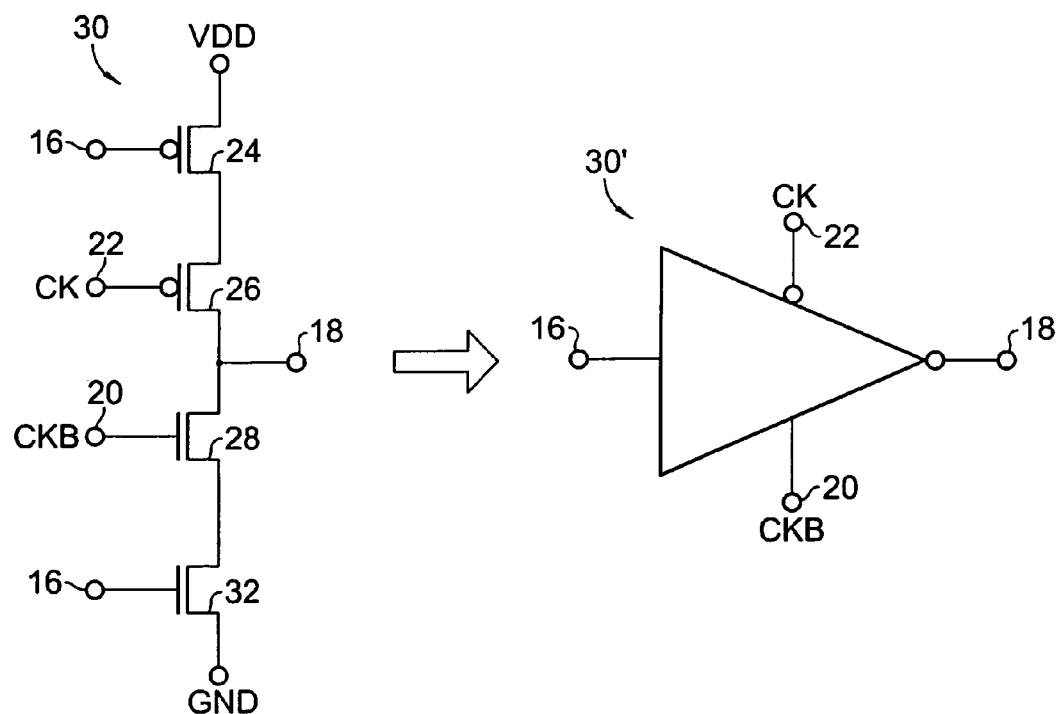
FIG. 1B is a schematic diagram of a gated inverter circuit including two N-channel transistors and two P-channel transistors in cascode connection, and the corresponding symbol for a gated inverter that is used in subsequent drawing figures.

In FIG. 1B a "gated inverter" 30 includes the cascode arrangement of P-channel transistors 24 and 26, and N-channel transistors 28 and 32. The input signal is applied to the gates 16 of transistors 24 and 32, the CK signal is applied to the gate 22 of transistor 26, and the CKB signal is applied to the gate 20 of transistor 28. The output signal is formed at the junction 18 between transistors 26 and 28. The combined current paths of transistors 24, 26, 28, and 32 are coupled between the VDD power supply and ground. A symbol for gated inverter 30' is shown in which the two transistors are represented as a triangle, wherein only the input 16, the inverted output 18, and clock inputs 20 and 22 are shown.

While the function of circuits 10 and 30 is essentially the same, i.e. to pass a signal from the input to the output under control of the clock signal, it should be noted that the gated inverter 30 inverts the input signal and also has a much higher input impedance than pass gate circuit 10.

Figure 2:
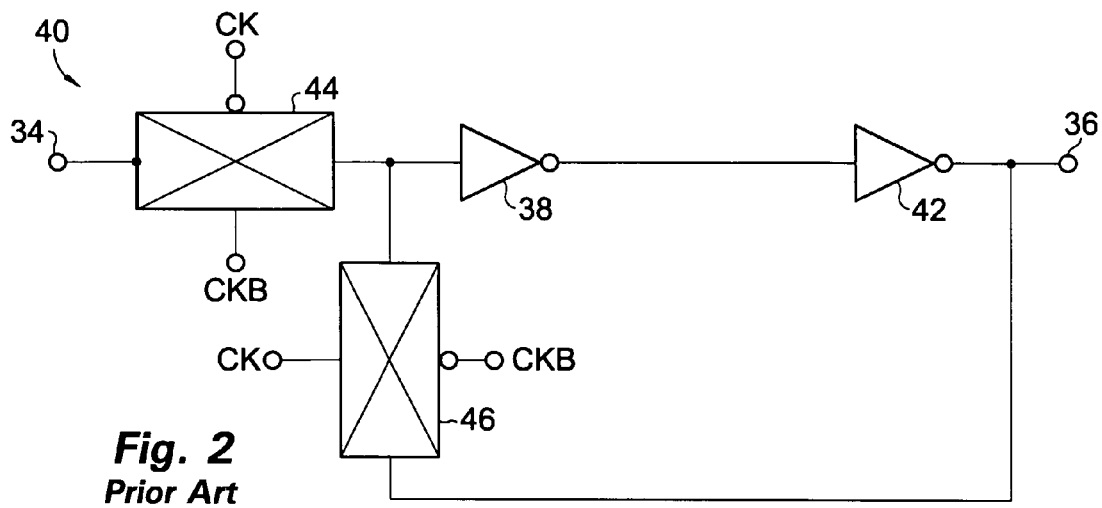
FIG. 2 is a schematic diagram of a prior art latch stage using pass gates.

Referring now to FIG. 2, a conventional latch stage 40 is shown having an input 34 and an output 36. A first pass gate 44 receives the input signal and is coupled to a first inverter 38 and a second pass gate 46. Inverter 38, in turn, is coupled to a second inverter 42. The output signal terminal 36 is formed at the output of the second inverter 42. The function of latch 40 is to pass the input signal to the output 36 under a first clock data state and to retain the data state at the output under a second clock data state.

Figure 3:
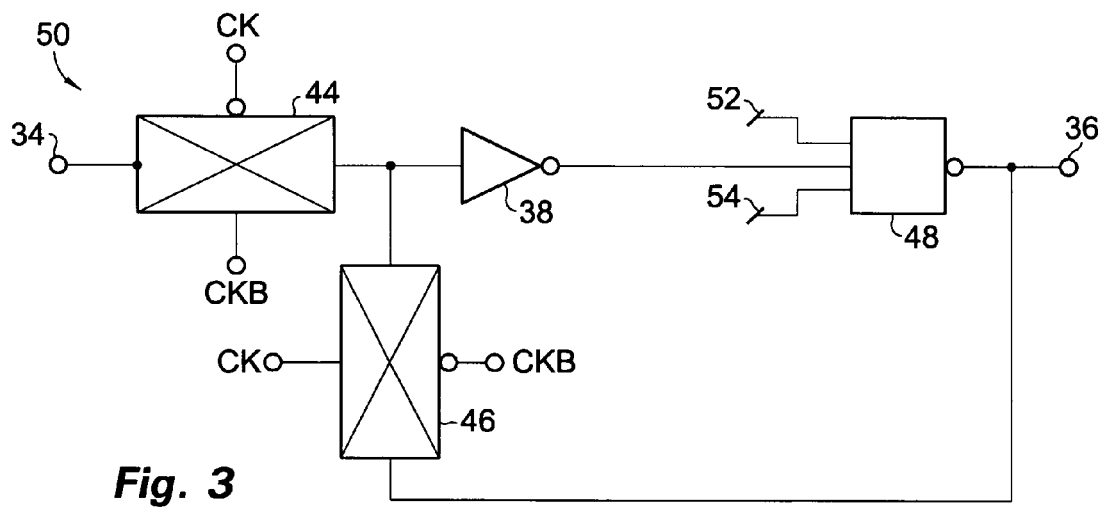
FIG. 3 is a schematic diagram of a first embodiment of an error-correcting partial latch stage according to the present invention.

Referring now to FIG. 3, latch 40 has been modified to form an error-correcting partial latch stage 50. In particular, note that the second inverter 42 is replaced with a "correcting inverter stage" 48, which is described in further detail below. The correcting inverter stage 48 has an inverting output as previously described inverter 42, but has three inputs. A first input is supplied by the output of inverter 38, and the other inputs 52 and 54 are provided by two other such partial latch stages 50 (not shown in FIG. 3) that are described in further detail below.

Figure 4:
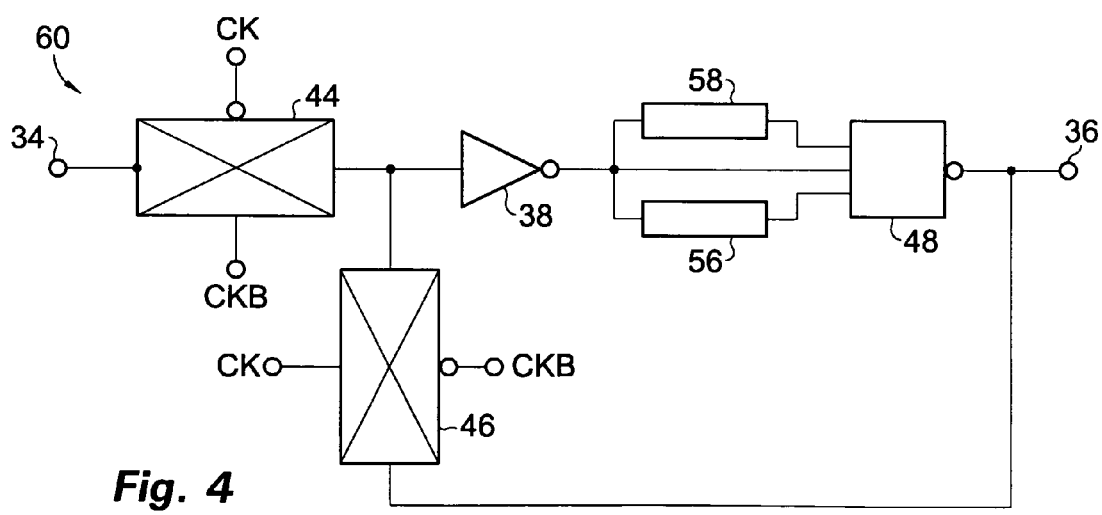
FIG. 4 is a schematic diagram of a first embodiment of an error-correcting delay latch stage according to the present invention.

Referring now to FIG. 4, latch 40 has been modified to form an error-correcting delay latch stage 60. In particular, note that the second inverter 42 is replaced with a "correcting inverter stage" 48 and two delay circuits 56 and 58, which eliminates the need for adjacent partial latch stages as described above. Delay circuits 56 and 58 provide differing delay times and may be modified to include a preset and clear function as is described in further detail below with respect to FIG. 13.

Figure 5:
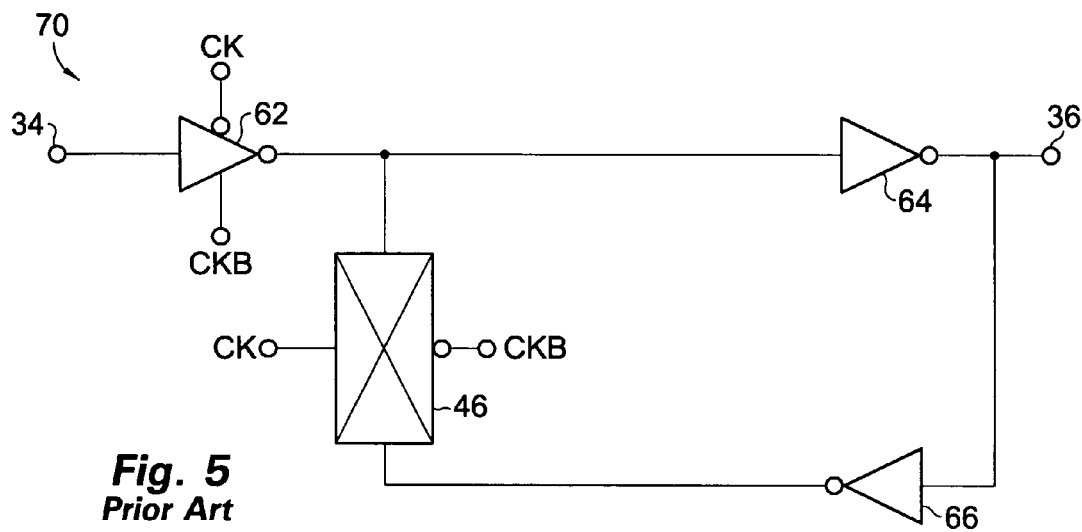
FIG. 5 is a schematic diagram of a prior art latch stage using a gated inverter and a pass gate.

Referring now to FIG. 5, a second conventional latch stage 70 is shown having a gated inverter 62 at the input for greater input impedance. Gated inverter 62 receives the input signal at node 34 and is coupled to a first inverter 64 and pass gate 46. Inverter 64, in turn, is coupled to a second inverter 66. The output signal terminal is formed at the connection between inverter 64 and inverter 66 for providing the output signal at node 36.

Figure 6:
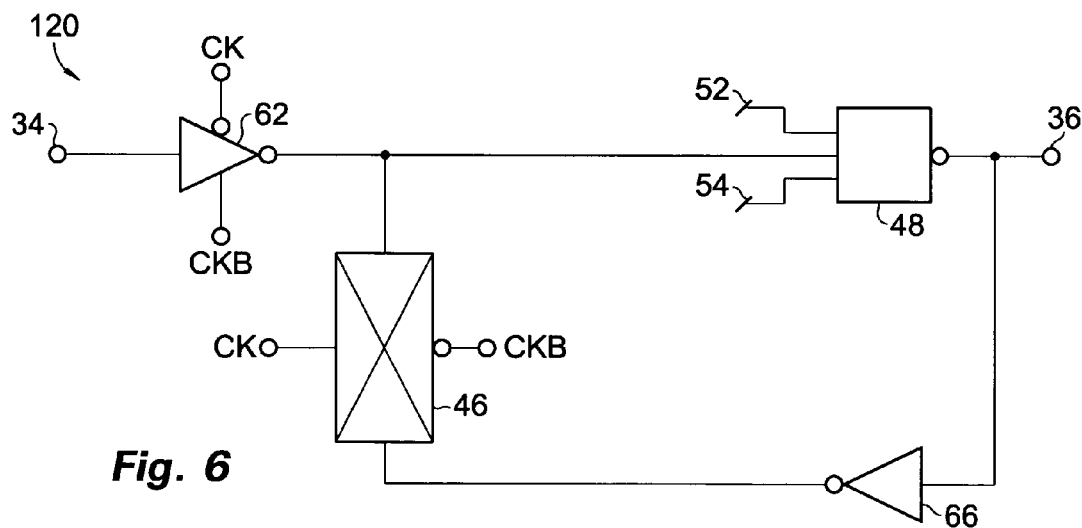
FIG. 6 is a schematic diagram of a second embodiment of an error-correcting partial latch stage according to the present invention.

Referring now to FIG. 6, latch 70 has been modified to form an error-correcting partial latch stage 120. In particular, note that inverter 64 is replaced with a correcting inverter stage 48. The correcting inverter stage 48 has three inputs an inverting output as previously described. A first input signal is supplied by the output of gated inverter 62, and the other two inputs are provided by two other such partial latch stages 120 (not shown in FIG. 6).

Figure 7:
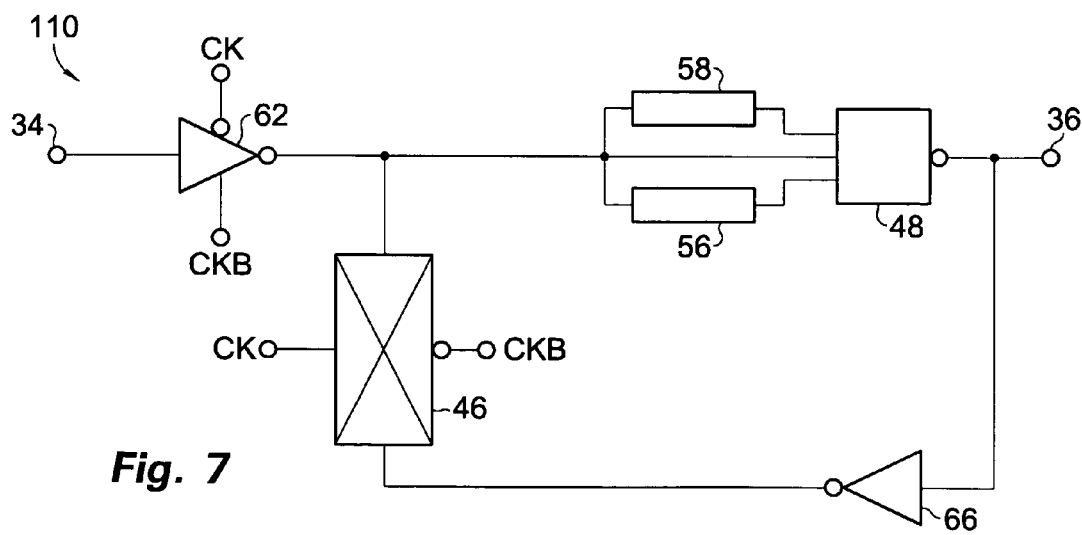
FIG. 7 is a schematic diagram of a second embodiment of an error-correcting delay latch stage according to the present invention.

Referring now to FIG. 7, latch 70 has been modified to form an error-correcting delay latch stage 110. In particular, note that the second inverter 64 is replaced with a correcting inverter stage 48 and two delay circuits 56 and 58, which eliminates the need for adjacent partial latch stages as described above. Delay circuits 56 and 58 provide differing delay times and may be modified to include a preset and clear function as is described in further detail below with respect to FIG. 13.

Figure 8:
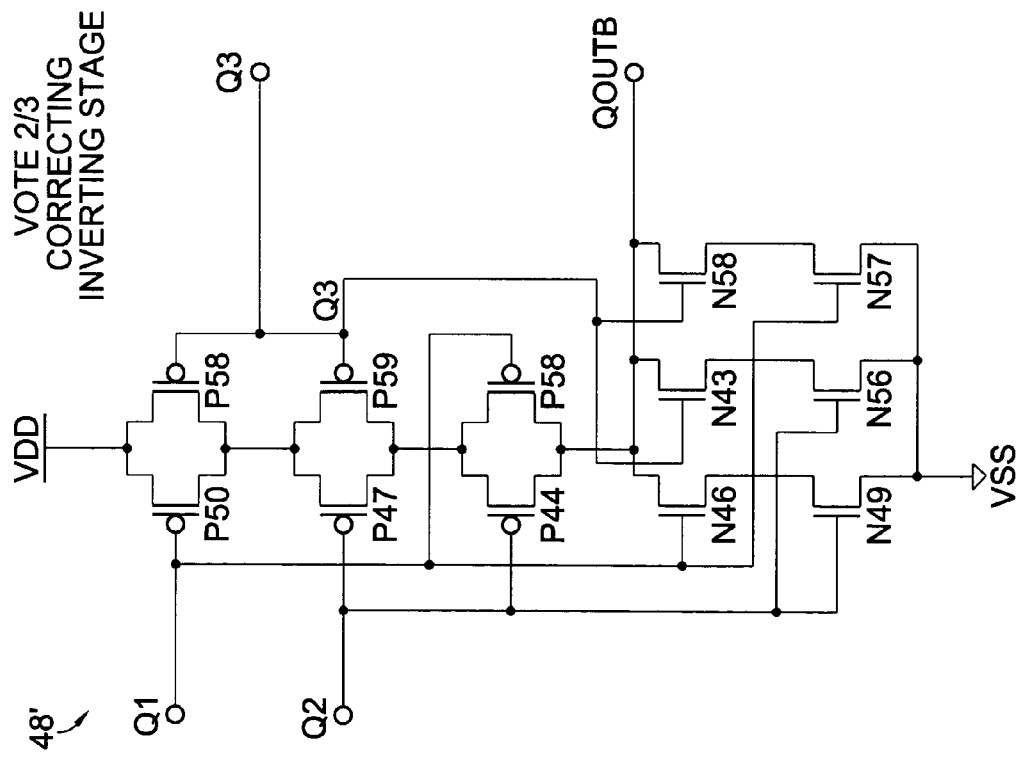
FIG. 8 is a transistor-level schematic diagram of a correcting inverter stage used in the error-correcting latch stages of FIGS. 3, 4, 6, and 7.

Referring now to FIG. 8, a correcting inverter stage 48' is shown in a transistor-level implementation. In the transistor-level implementation shown in FIG. 8, the inputs of the correcting inverter stage are labeled Q1, Q2, and Q3. The inverting output is labeled QOUTB. Correcting inverter stage 48' is a CMOS transistor circuit having three differential PMOS stages coupled to three cascoded NMOS stages. The three PMOS stages include parallel-coupled P-channel transistors P50 and P58 in which the gates thereof receive the Q1 and Q3 signals, parallel-coupled P-channel transistors P47 and P59 in which the gates thereof receive the Q2 and Q3 signals, and parallel-coupled P-channel transistors P44 and P58 in which the gates thereof receive the Q2 and Q1 signals. The three NMOS stages include cascode-coupled N-channel transistors N46 and N49 in which the gates thereof receive the Q1 and Q2 signals, cascode-coupled N-channel transistors N43 and N56 in which the gates thereof receive the Q3 and Q2 signals, and cascode-coupled N-channel transistors N58 and N57 in which the gates thereof receive the Q3 and Q1 signals. The QOUTB signal is provided at the drains of N-channel transistors N46, N43, and N58.

Figure 9:
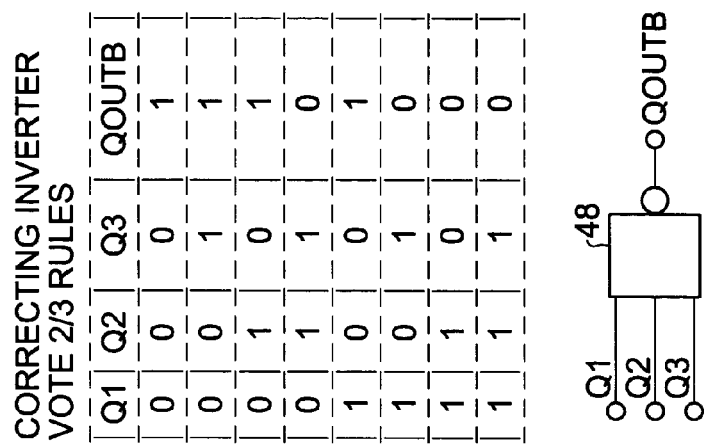
FIG. 9 shows the symbol and corresponding logic table for the correcting inverter stage of the present invention.

Referring now to FIG. 9, the standard symbol for the correcting inverter stage 48 is shown, along with the corresponding logic table in which Q1, Q2, and Q3 are the inputs to the correcting inverter and QOUTB is the inverting output signal. The logic table is given below:

| LOGIC TABLE FOR CORRECTING INVERTER 48 | | | |
|---|---|---|---|
| Q1 (Input) | Q2 (Input) | Q3 (Input) | QOUTB |
| 0 | 0 | 0 | 1 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 0 |

Referring now to FIGS. 10 and 11, an AND-NOR gate-level implementation of a correcting inverter stage 48" includes first, second, and third two-input AND gates 72, 74, and 76 coupled to a three-input NOR gate 78. A NAND gate-level implementation of a correcting inverter stage 48''' includes first, second, and third two-input NAND gates 82, 84, and 86 coupled to a three-input NAND gate 88, which is in turn coupled to inverter 92 to provide the same logic function as the two previous correcting inverter stages 48' and 48" and set forth in the table above.

Figure 12A:
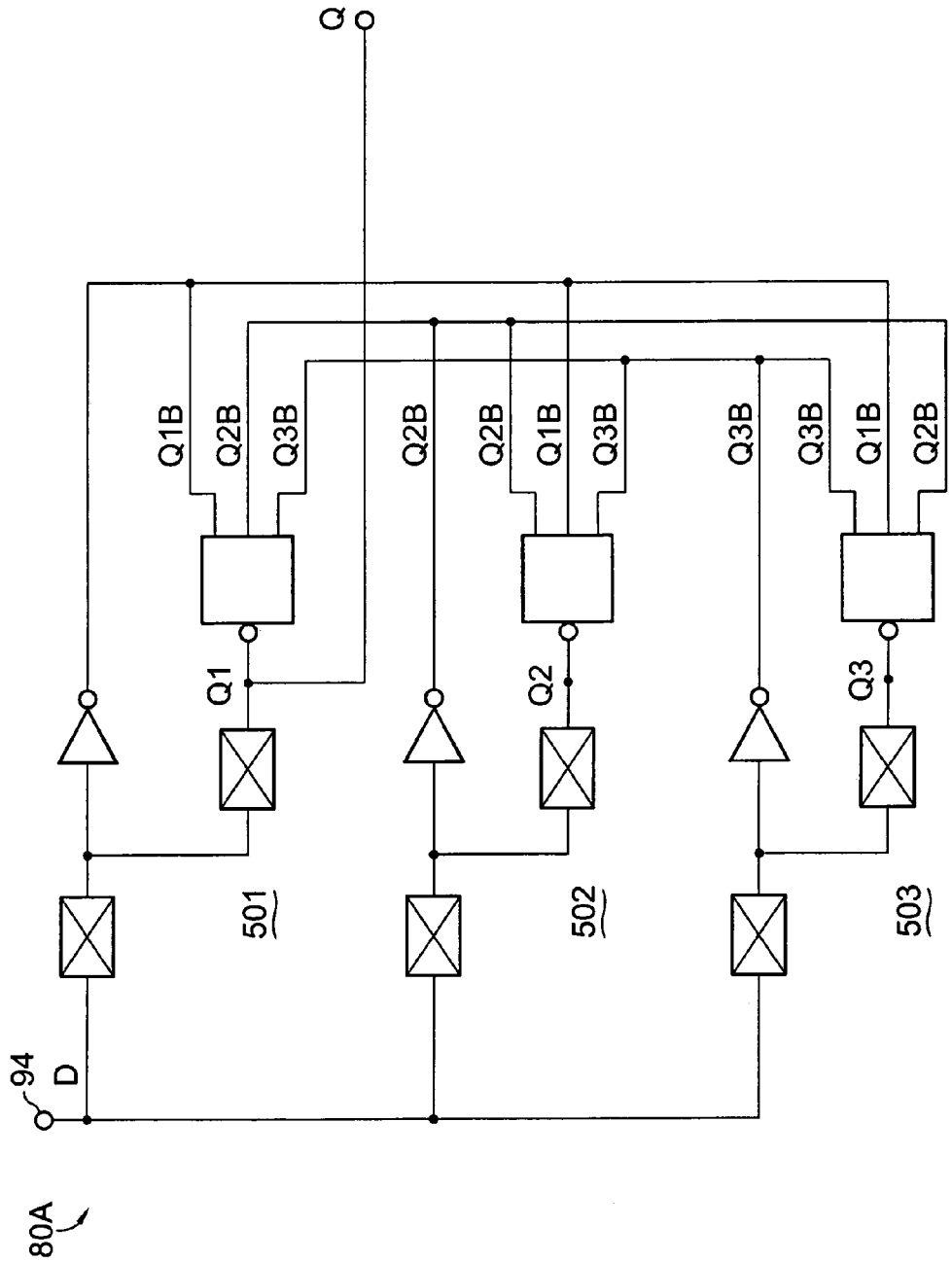
FIG. 12A is a schematic diagram of a full correcting latch stage using the partial latch stages of FIG. 3 according to the present invention with a single input and the Q1 signal being chosen to provide the output signal.

Referring now to FIG. 12A a full latch stage 80A using pass gates is shown. Partial latch stages 501, 502, and 503 are interconnected as shown. Each partial latch stage receives the input signal at terminal 94 and the output signals Q1B, Q2B, and Q3B are interconnected as shown. The Q1B output signal is generated in partial latch stage 501, the Q2B output signal is generated in partial latch stage 502, and the Q3B output signal is generated in partial latch stage 503. Any one of the outputs Q1, Q2, or Q3 may be used as the final latch output. In the embodiment shown in FIG. 12A, the Q1 signal is used as the final latch output. The Q2 or Q3 signals could also be used.

Referring now to FIG. 12B, a full correcting latch stage 80B is shown using the partial latch stages of FIG. 3. Latch stage 80B includes a provision for split inputs (D1, D2, and D3) and outputs (Q1, Q2, Q3) according to the present invention. The latch stage 80B can be useful in certain applications such as the master-slave flip-flop shown in FIG. 14, which is described in further detail below.

Figure 12C:
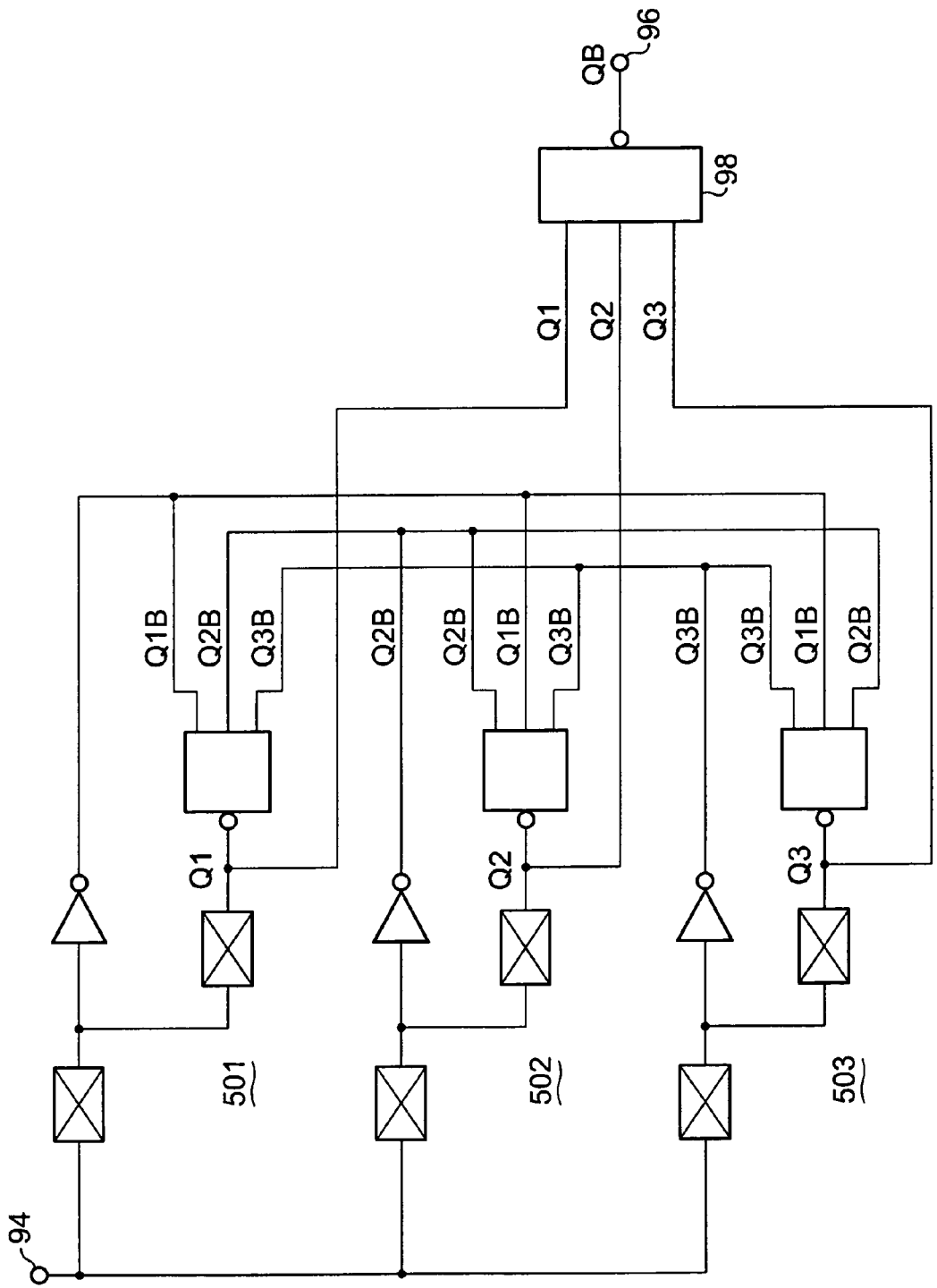
FIG. 12C is a schematic diagram of a full correcting latch stage using the partial latch stages of FIG. 3 with provision for an additional correcting stage for the three outputs according to the present invention.

Referring now to FIG. 12C, a full correcting latch stage 80C is shown using the partial latch stages of FIG. 3. Latch stage 80C includes a provision for an additional correcting stage 98 for receiving the three outputs (Q1, Q2, Q3) according to the present invention. The optional error correcting inverter stage 98 may be used for further immunity to SEU events or noise coupling to generate output 96.

Full latch stages 80A, 80B, and 80C may be easily modified to substitute the second partial latch stage embodiment shown in FIG. 7 for partial latch stages 501, 502, and 503.

Figure 13:
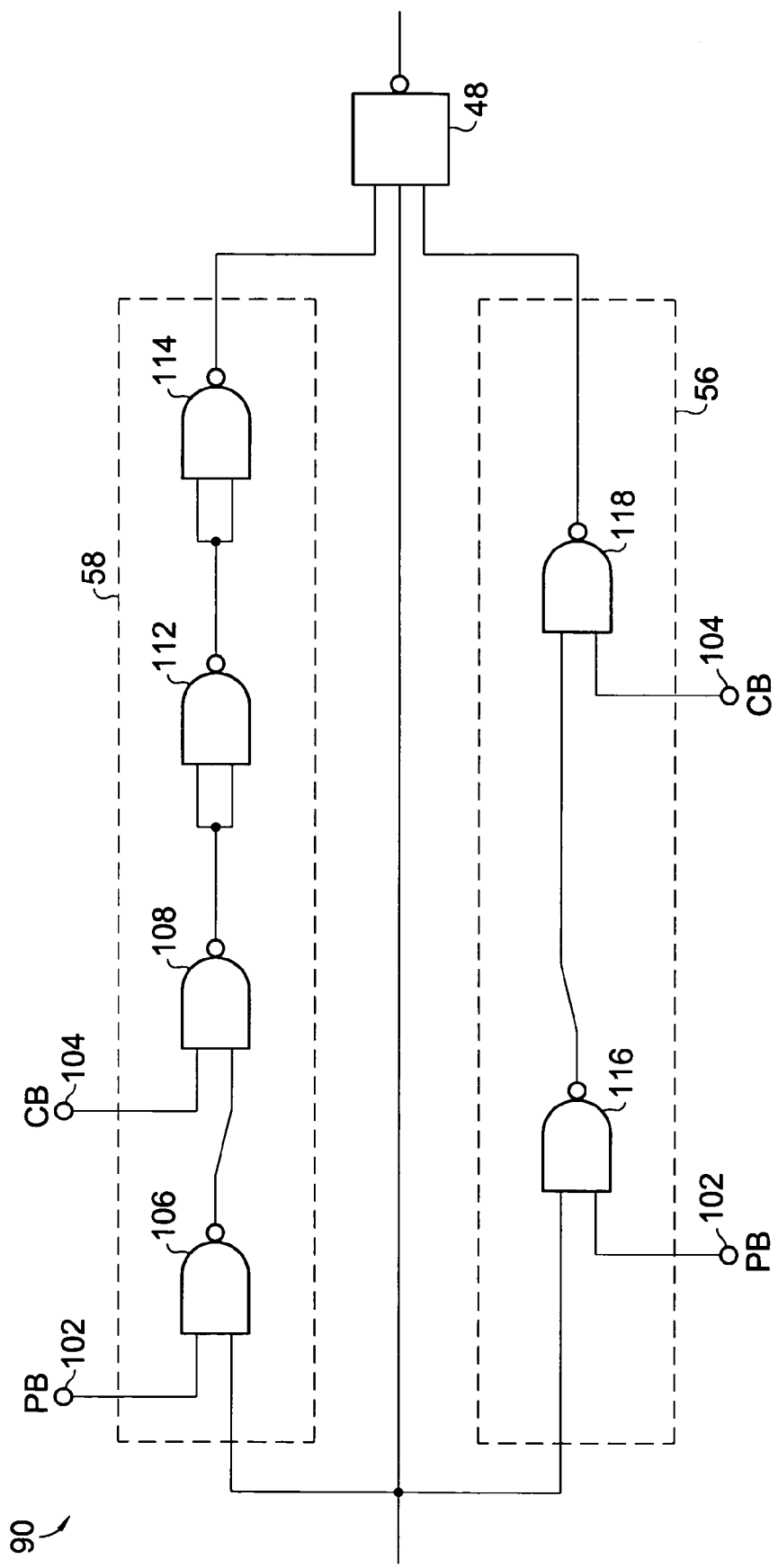
FIG. 13 is a schematic diagram of a logic gate embodiment of the delay circuits used in the delay latch stages of FIGS. 4 and 7 according to the present invention, and, in particular, showing an implementation of preset and clear functions.

Referring now to FIG. 13, a portion 90 of delay latch 60 of FIG. 4 or delay latch 110 of FIG. 7 is shown including a first delay circuit 58, a second delay circuit 56, and a correcting inverter 48. The first delay circuit 58 has a delay of N times that of the second delay circuit 56. In the particular embodiment shown in FIG. 13, N is set to two. The first delay circuit 58 includes serially-connected NAND gates 106, 108, 112, and 114. NAND gate 106 includes a PB (preset-bar) input 102, and the output is coupled to NAND gate 108. NAND gate 108 includes a CB (clear-bar) input 104, and the output is coupled to NAND gate 112. NAND gates 112 and 114 have coupled inputs and are used only to provide the required delay through delay circuit 58. The output of NAND gate 114 is coupled to correcting inverter 48. Similarly, delay circuit 56 includes serially-connected NAND gates 116 and 118. NAND gate 116 includes a PB (preset-bar) input 102, and the output is coupled to NAND gate 118. NAND gate 118 includes a CB (clear-bar) input 104, and the output is coupled to correcting inverter 48.

It is important to note that in delay circuits 58 and 56, only one desirable embodiment is shown. As is known by those in the art, various combinations of gates may be used to provide a desired delay. Similarly, various logical combinations of AND, OR, NAND, NOR or transistor-level logic in conjunction with other known delay elements may also be used to provide the preset and clear functions in conjunction with the required delay times.

It is also important to note that the preset and clear functions provided by delay circuits 58 and 56 are also error-correcting. That is, only two of the three preset and clear inputs (recall that three separate partial latch stages are required) need be true to form a valid preset or clear function.

Figure 14:
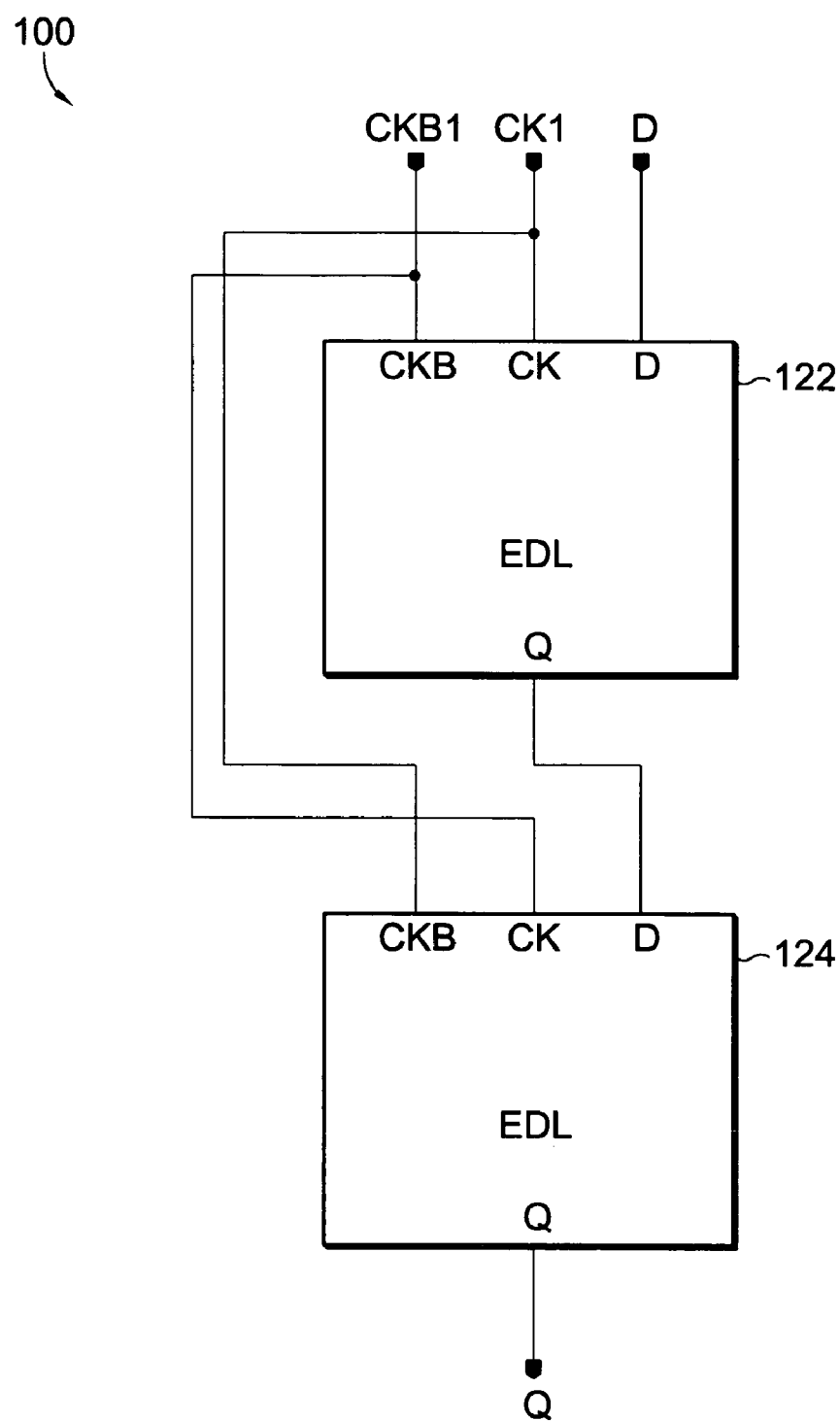
FIG. 14 is a schematic diagram of a correcting master slave flip-flop according to the present invention where the block labeled EDL can be either a parallel correcting latch or a delayed correcting latch.

Referring now to FIG. 14, An error-correcting D-type master-slave flip-flop 100 is shown including a master latch stage 122 using any of the previously described "full" latch stages or delay latch stages, each full latch stage having an input for receiving a data input signal, a correcting inverter stage, and an output for providing an intermediate signal, and a slave latch stage 124 using any of the previously described "full" latch stages or delay latch stages coupled to the master last stage, each latch stage having an input for receiving the intermediate signal, a correcting inverter stage, and an output for providing an output signal.

A still further measure of immunity to SEU events can be provided by using a parallel bus scheme, which is described in greater detail below.

Figure 15:
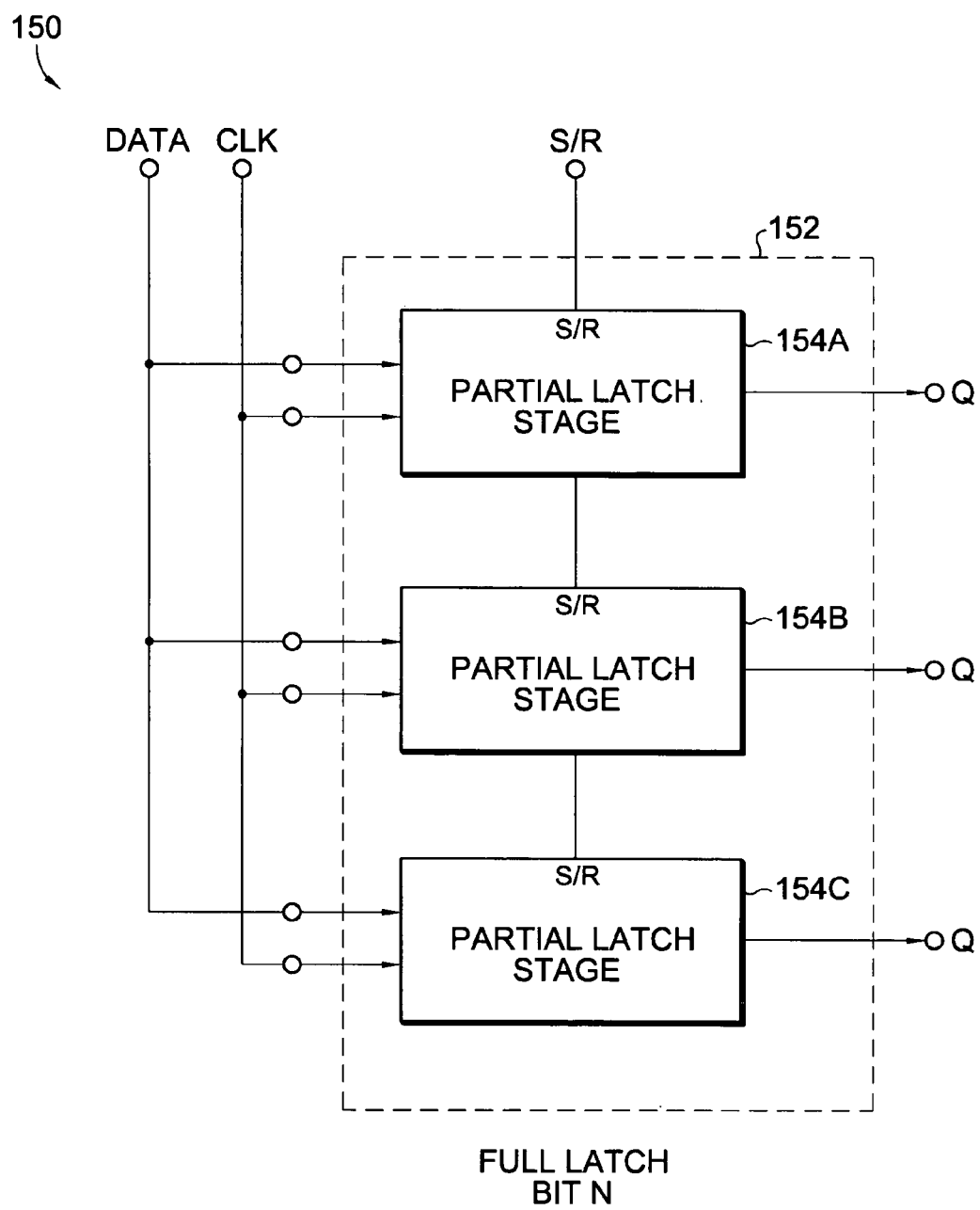
FIG. 15 is a schematic diagram of a single bus arrangement for an error-correcting latch according to FIG. 12A.

One single bus embodiment of a busing scheme for use with the error-correcting latch of the present invention is shown in FIG. 15. Circuit 150 includes a full latch 152 including latch stages 154A, 154B, and 154C. In circuit 150 the CLK inputs for each of the latch stages are coupled together and driven by a single CLK bus. Similarly, the Data inputs are also coupled together and driven by a single Data bus. Finally, the control inputs such as set, reset, clear, or preset are also coupled together and coupled to a single S/R bus.

The problem with the busing arrangement shown in FIG. 15 is that it is susceptible to SEU events, apart from whatever immunity is afforded by latch 152 itself. This is because the circuitry that drives the CLK, Data, or S/R bus can itself be impacted by an SEU event. In a worst case situation, an invalid data state can be present on all three CLK, Data, or S/R inputs, possibly leading to an invalid data output on all of the Q outputs of latch 150.

Figure 16:
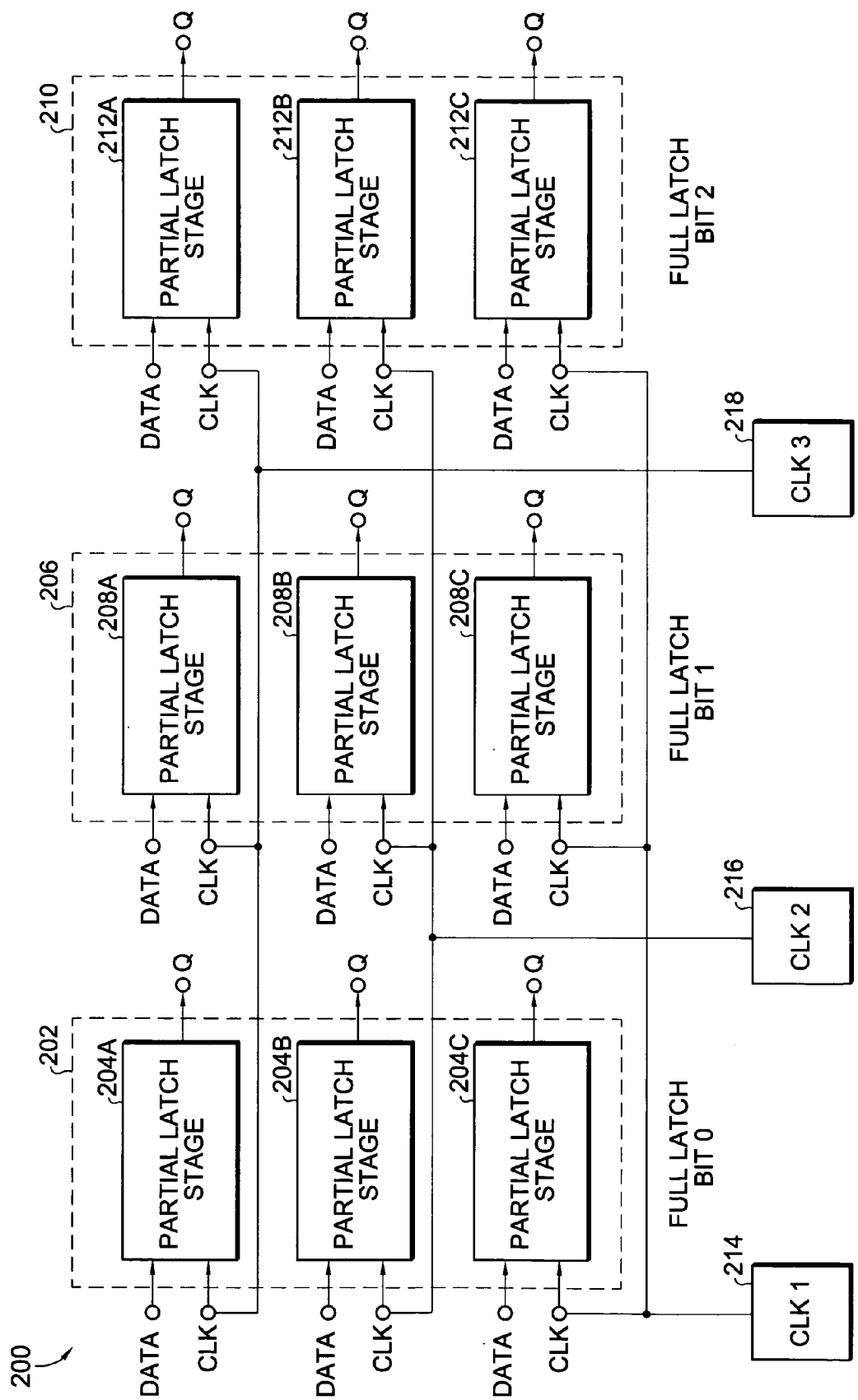
FIG. 16 is a schematic diagram of a parallel CLK bus arrangement terminating in integrated circuit bonding pads for a plurality of error-correcting latches according to the present invention.

Referring now to FIG. 16, circuit 200 includes full latches 202, 206, and 210. Each latch includes first, second, and third error-correcting latch stages each including a CLK input. Full latch 202 includes partial latch stages 204A, 204B, and 204C. Full latch 206 includes partial latch stages 208A, 208B, and 208C. Full latch 210 includes partial latch stages 212A, 212B, and 212C. Each partial latch stage includes a two-of-three voting circuit placed in a feedback loop of the latch stage according to the present invention.

First, second, and third CLK signal buses designated CLK 1, CLK 2, and CLK 3 are respectively coupled to the clock input of the first, second, and third error-correcting latch stages of each full latch 202, 206, and 210 as shown. In circuit 200, the same CLK clock signal is provided on the first, second, and third clock signal buses CLK 1, CLK2, and CLK 3 to provide an extra measure of SEU event immunity. In an integrated circuit embodiment the first, second, and third clock signal buses CLK 1, CLK 2, and CLK 3 are respectively coupled to first, second, and third bonding pads 214, 216, and 218 as shown in FIG. 16.

Figure 17:
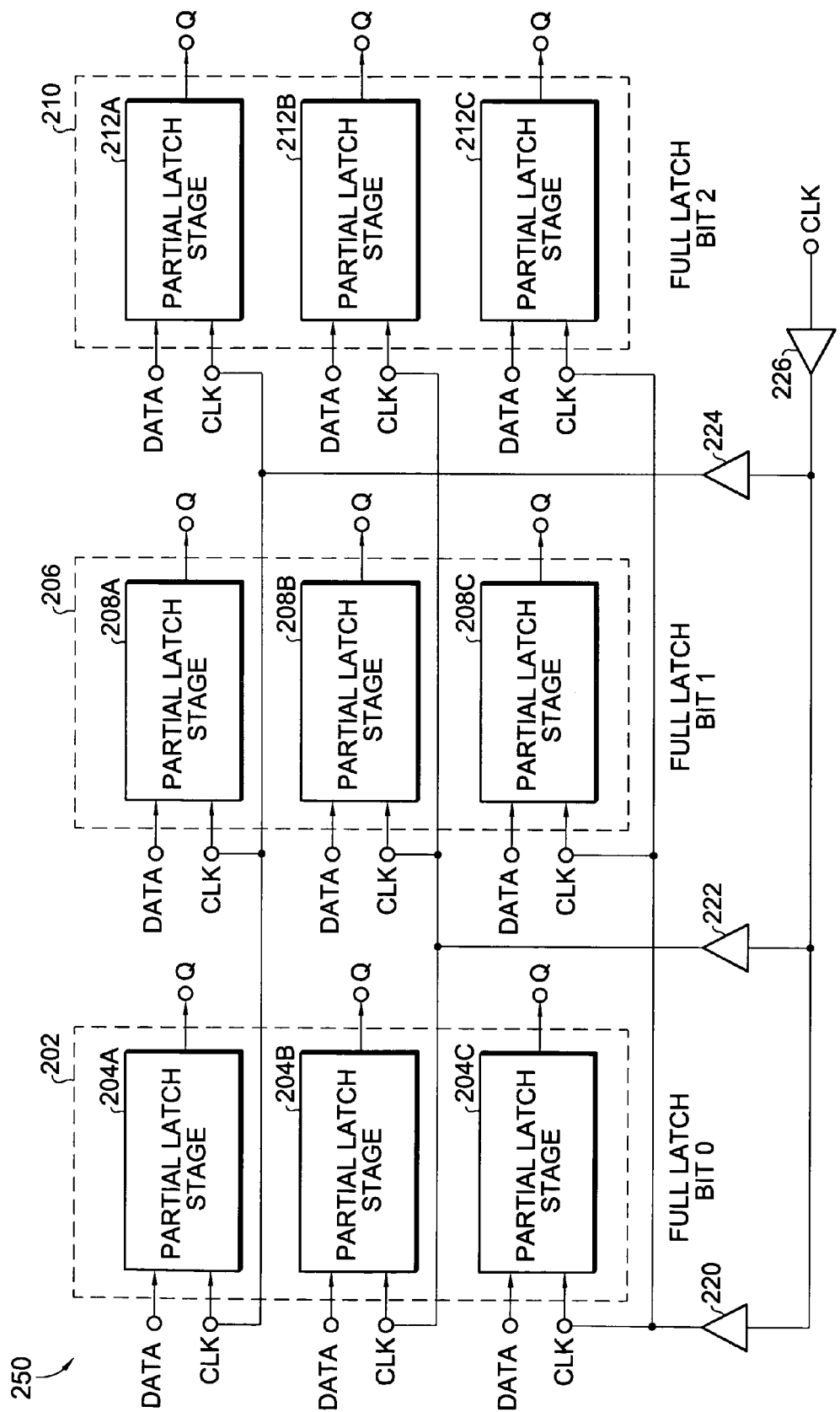
FIG. 17 is a schematic diagram of an alternative parallel CLK bus arrangement including separate driver circuitry for a plurality of error-correcting latches according to the present invention.

Referring now to FIG. 17, a circuit 250 is shown having the same arrangement of full latches and partial latches as is shown in FIG. 16. However, a slightly different CLK bus arrangement is shown in which the three bonding pads are replaced by three separate driver circuits. The first, second, and third CLK signal buses are respectively driven by first, second, and third driver circuits 220, 222, and 224. In turn, the first, second, and third driver circuits 220, 222, and 224 are driven by a fourth driver circuit 226, which receives the CLK signal input. Driver circuit 226 is preferably sized to have a strong output drive capability such that routine SEU events do not easily change the data state of the driver output.

Two examples of a parallel CLK bus scheme are shown in FIGS. 16 and 17. For the sake of clarity only the CLK buses are shown. The CLK busing scheme does not impinge on the ability to use full latch stages 202, 206, and 210 in any manner deemed necessary for a specific application. Any combination of interconnection between the Data inputs and Q outputs can still be accommodated consistent with the present invention. Also, while three full latches stages are shown, any number can be used to accommodate the requirements of a specific implementation.

Figure 18:
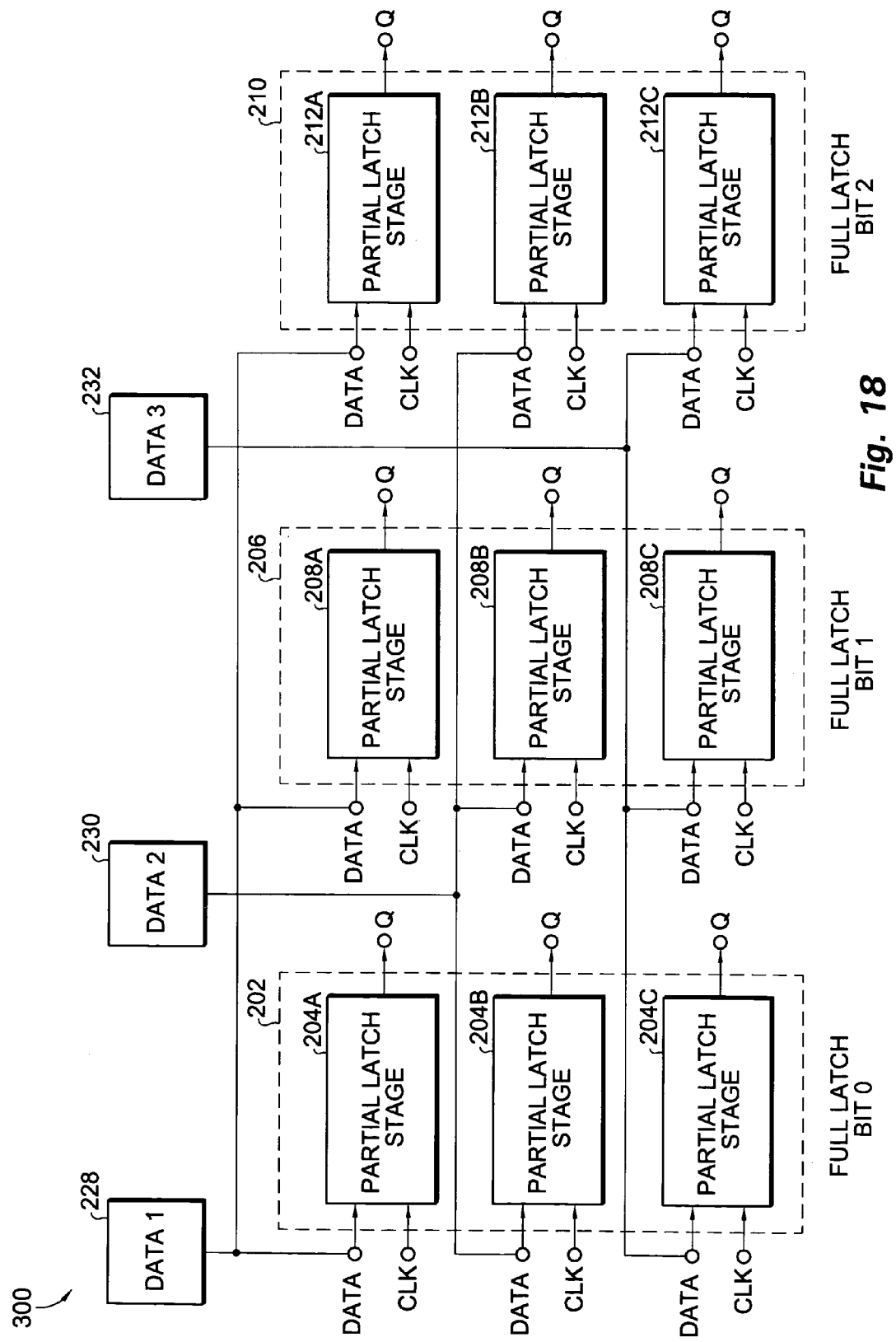
FIG. 18 is a schematic diagram of a parallel Data bus arrangement terminating in integrated circuit bonding pads for a plurality of error-correcting latches according to the present invention.

Referring now to FIG. 18, the same arrangement of partial latch stages and full latch stages is shown for circuit 300 as in previous FIGS. 16 and 17. In FIG. 18, the parallel bus scheme is extended to include the Data inputs to full latches 202, 206, and 210. The first data signal bus Data 1 is coupled to the first data input of the first, second, and third error-correcting latch stages of full latch 202. The second data signal bus Data 2 is coupled to the second data input of the first, second, and third error-correcting latch stages of full latch 202. The third data signal bus Data 3 is coupled to the third data input of the first, second, and third error-correcting latch stages of full latch 202. The same Data signal is provided on the first, second, and third data signal buses, which are terminated in integrated circuit bonding pads 228, 230, and 232. Other arrangements of interconnection between the data inputs and outputs for the full latches shown in FIG. 18 are of course possible. The parallel bus scheme for circuit 300 provides an extra measure of SEU immunity above that provided by an arrangement in which the three data inputs are simply coupled together with a single data bus and driver circuit.

Figure 19:
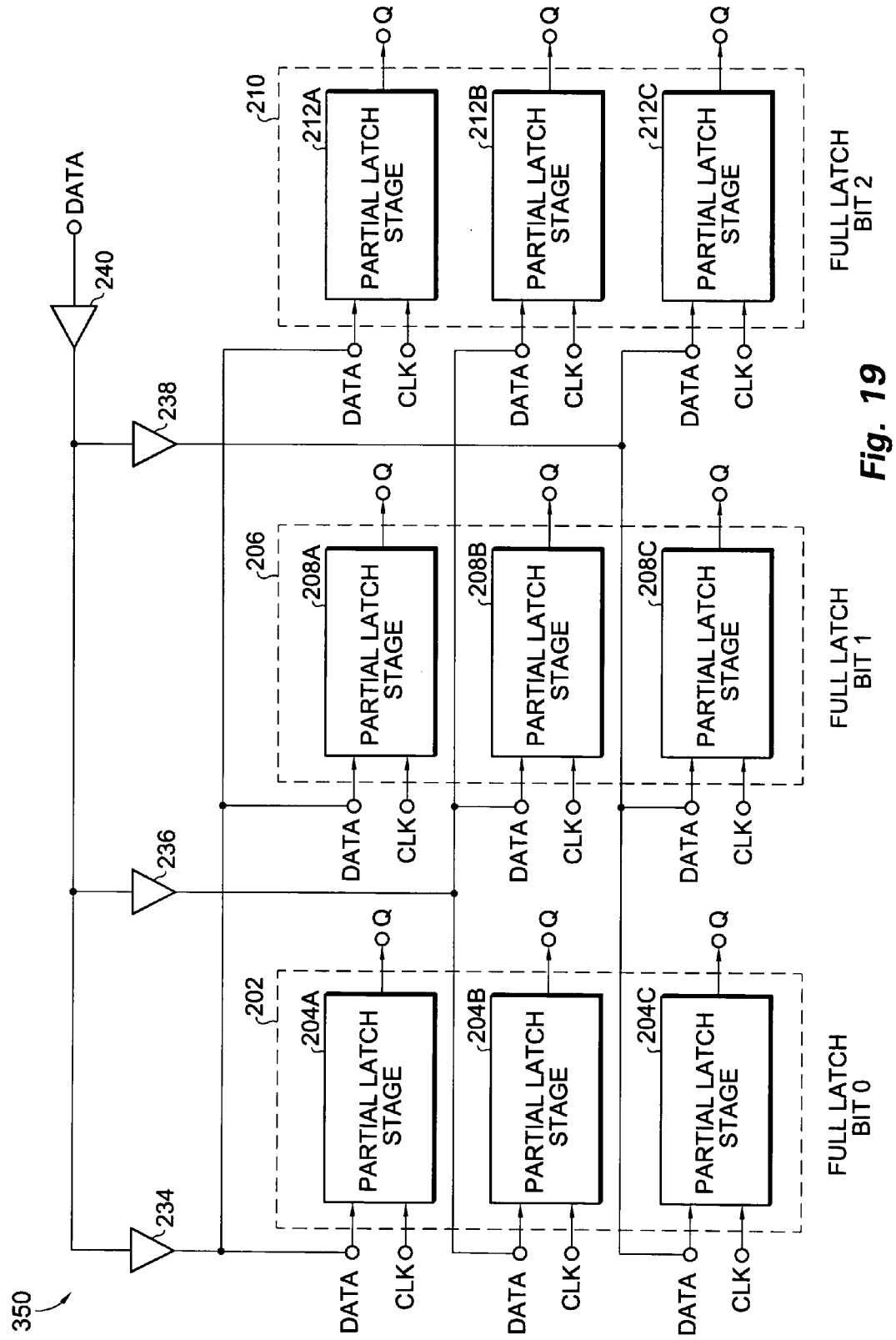
FIG. 19 is a schematic diagram of an alternative parallel Data bus arrangement including separate driver circuitry for a plurality of error-correcting latches according to the present invention.

Referring now to FIG. 19, a circuit 350 is shown having the same arrangement of full latches and partial latches as is shown in FIG. 18. However, a slightly different Data bus arrangement is shown in which the three bonding pads are replaced by three separate driver circuits. The first, second, and third Data signal buses are respectively driven by first, second, and third driver circuits 234, 236, and 238. In turn, the first, second, and third driver circuits 234, 236, and 238 are driven by a fourth driver circuit 240, which receives the Data signal input. Driver circuit 240 is preferably sized to have a strong output drive capability such that routine SEU events do not easily change the data state of the driver output.

Two examples of a parallel Data bus scheme are shown in FIGS. 18 and 19. For the sake of clarity only the Data buses and Q output connections are shown. The specific embodiment of the Data busing scheme does not impinge on the ability to use full latch stages 202, 206, and 210 in any manner deemed necessary for a specific application.

Figure 20:
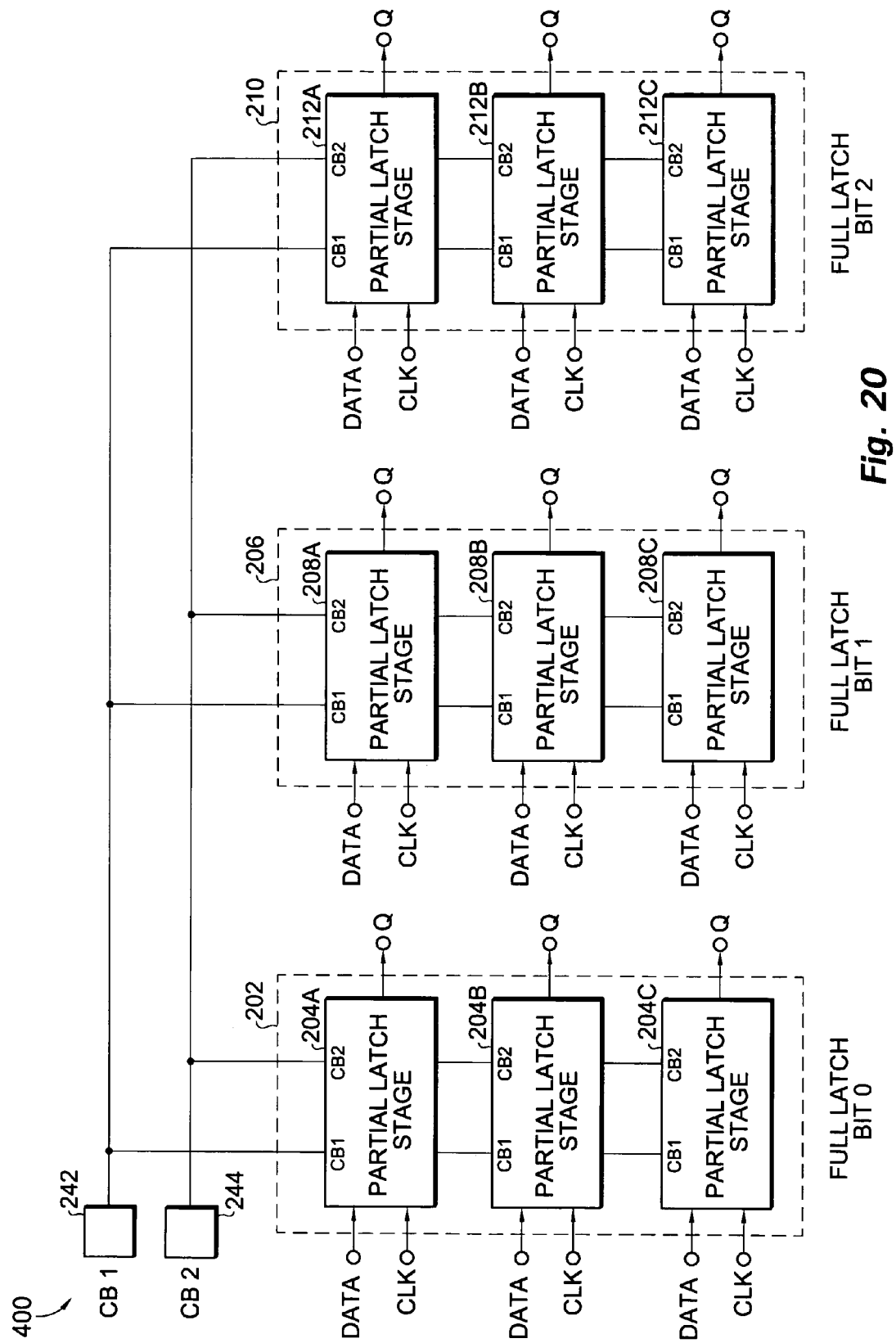
FIG. 20 is a schematic diagram of a parallel control signal (CB) bus arrangement terminating in integrated circuit bonding pads for a plurality of error-correcting latches according to the present invention.
Figure 21:
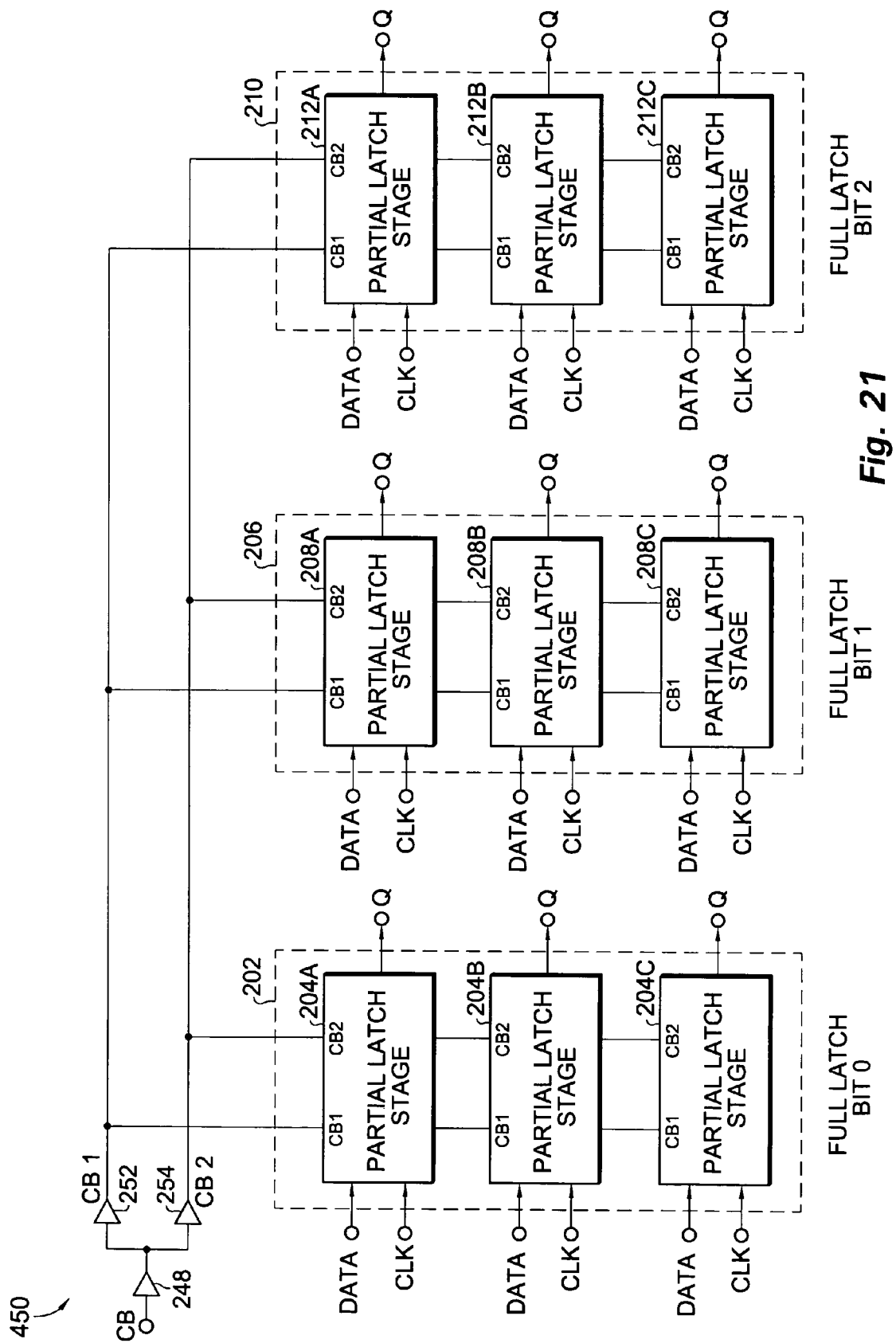
FIG. 21 is a schematic diagram of an alternative parallel control signal (CB) bus arrangement including separate driver circuitry for a plurality of error-correcting latches according to the present invention.

Referring now to FIGS. 20 and 21, the parallel bus scheme is extended to the control signal or signals that may be associated with the full error-correcting latch stages. In circuit 400 of FIG. 20, a parallel bus scheme terminating in bonding pads 242 and 244 is shown. The control signal buses are labeled CB 1 and CB 2, which correspond the two "clear bar" control signals associated with gates 108 and 118 shown in FIG. 13. While the clear signal is shown in FIG. 20, the control signal buses both contain the same control signal which may be a "set", "reset", "precharge", or other control signal necessary for the proper operation of latches 202, 206, and 210. The "CB" designation refers to a latch having a "clear bar" control signal input as described above. Referring to circuit 450 of FIG. 21, the alternative embodiment for a parallel control signal bus embodiment is shown in which the bonding pads have been replaced with driver circuits 252 and 254, which are in turn driven by driver circuit 248 that receives the CB control signal. Multiple parallel bus schemes can be used for multiple control inputs such as separate precharge and clear control inputs, if desired.

Regarding the embodiments of the present invention shown in FIGS. 15–21 it will be apparent to those skilled in the art that the following changes, among others can be made. The number of latches can be extended beyond the three shown in the drawing figures, while the parallel buses can be similarly extended to connect to the desired inputs of each of the latch stages. Only one, or a combination of all three CLK, Data, and/or control signal parallel bus schemes may be used as desired. The bonding pad and driver circuit implementations can be used together if desired, for different CLK, Data, or single or multiple control signals. The interconnection between latches is not deemed to be impacted by the use of the parallel bus scheme. Similarly, the parallel bus scheme of the present invention can be used to build the data flip-flop shown in FIG. 14. Single or multiple Q outputs can be used as desired according to the teachings of the present invention.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

I claim:

1. An error-correcting latch comprising:
    first, second, and third error-correcting latch stages each including a clock input; and
    first, second, and third clock signal buses respectively coupled to the clock input of the first, second, and third error-correcting latch stages through a first, second, and third driver circuit, and
    wherein each latch stage further comprises a two-of-three voting circuit placed in a feedback loop of the latch stage.

2. The error-correcting latch as in claim 1 wherein a same clock signal is provided on the first, second, and third clock signal buses.

3. The error-correcting latch as in claim 1 wherein the first, second, and third clock signal buses are respectively coupled to first, second, and third bonding pads.

4. The error-correcting latch as in claim 1 wherein the first, second, and third driver circuits are driven by a common fourth driver circuit.

5. The error-correcting latch as in claim 1 further comprising at least one additional error-correcting commonly latch coupled to the first, second, and third clock signal buses.

6. An error-correcting latch comprising:
    first, second, and third error-correcting latch stages each including a data input; and
    first, second, and third data signal buses respectively coupled to the data input of the first, second, and third error-correcting latch stages through a first, second, and third driver circuit, and
    wherein each latch stage further comprises a two-of-three voting circuit placed in a feedback loop of the latch stage.

7. The error-correcting latch as in claim 6 wherein a same data signal is provided on the first, second, and third data signal buses.

8. The error-correcting latch as in claim 6 wherein the first, second, and third data signal buses are respectively coupled to first, second, and third bonding pads.

9. The error-correcting latch as in claim 6 wherein the first, second, and third driver circuits are driven by a common fourth driver circuit.

10. The error-correcting latch as in claim 6 further comprising at least one additional error-correcting latch commonly coupled to the first, second, and third data signal buses.

11. An error-correcting latch comprising:
    first, second, and third error-correcting latch stages each including at least two control signal inputs; and
    first and second control signal buses respectively coupled to the control signal inputs of the first, second, and third error-correcting latch stages, and
    wherein each latch stage further comprises a two-of-three voting circuit placed in a feedback loop of the latch stage.

12. The error-correcting latch as in claim 11 wherein a same control signal is provided on the first and second control signal buses.

13. The error-correcting latch as in claim 11 wherein the first and second control signal buses are respectively coupled to first and second bonding pads.

14. The error-correcting latch as in claim 11 further comprising at least one additional error-correcting latch commonly coupled to the first and second control signal buses.

15. The error-correcting latch stage as in claim 11 in which the control signal buses each comprise a preset signal bus.

16. The error-correcting latch stage as in claim 11 in which the control signal buses each comprise a clear signal bus.

17. The error-correcting latch stage as in claim 11 in which the control signal buses each comprise a set signal bus.

18. The error-correcting latch stage as in claim 11 in which the control signal buses each comprise a reset signal bus.

19. The error-correcting latch as in claim 11 wherein the first and second control signal buses are coupled to the control signal inputs of the first, second, and third error-correcting latch stages through first and second driver circuits.

20. The error-correcting latch as in claim 19 wherein the first and second driver circuits are driven by a common third driver circuit.

* * * * *